(12) United States Patent
Liu et al.

(10) Patent No.: US 6,319,823 B1
(45) Date of Patent: Nov. 20, 2001

(54) PROCESS FOR FORMING A BORDERLESS VIA IN A SEMICONDUCTOR DEVICE

(75) Inventors: Chia-Chen Liu, Hsinchu; Jyh-Ren Wu, Taipei, both of (TW)

(73) Assignee: Taiwan Semiconductor Manufacturing Corp., Hsinchu (TW)

( * ) Notice: Subject to any disclaimer, the term of this patent is extended or adjusted under 35 U.S.C. 154(b) by 0 days.

(21) Appl. No.: 09/482,421

(22) Filed: Jan. 13, 2000

(30) Foreign Application Priority Data

Oct. 18, 1999 (TW) .............................. 088117962

(51) Int. Cl.[7] .................................. H01L 21/4763
(52) U.S. Cl. .................. 438/637; 438/622; 438/625; 438/629; 438/631; 438/633; 438/634; 438/672; 438/675; 438/666; 438/671
(58) Field of Search ..................... 438/622, 625, 438/629, 631, 633, 634, 637, 672, 675, 666, 671

(56) References Cited

U.S. PATENT DOCUMENTS 5,518,963 * 5/1996 Park ..................................... 437/195
5,721,155 * 2/1998 Lee ..................................... 437/195

* cited by examiner

Primary Examiner—John F. Niebling
Assistant Examiner—David A Zarneke
(74) Attorney, Agent, or Firm—Jiawei Huang; J.C. Patents

(57) ABSTRACT

A method is used to form a borderless via in a semiconductor device. A conductive layer, a borophosphosilicate glass (BPSG) layer and a patterned first mask layer are formed on a dielectric layer in sequence. The BPSG layer is patterned into a BPSG plug while using the patterned first mask layer as a mask. A second mask layer is formed to cover the patterned first mask layer and the metal layer. The conductive layer is defined to form a conductive line beneath the BPSG plug and the second mask layer. The first and second photoresist mask layers are removed. An inter-metal dielectric layer is formed around the BPSG plug and the conductive line. A via is formed in the inter-metal dielectric layer by removing the BPSG plug. A barrier layer and a metal layer fill the via to form a metal plug.

11 Claims, 3 Drawing Sheets

PROCESS FOR FORMING A BORDERLESS VIA IN A SEMICONDUCTOR DEVICE

CROSS-REFERENCE TO RELATED APPLICATION

This application claims the priority benefit of Taiwan application serial No. 88117962, filed Oct. 18, 1999.

BACKGROUND OF THE INVENTION

1. Field of the Invention

The present invention relates to a method for fabricating an integrated circuit. More particularly, the present invention relates to a method for forming a borderless via in a semiconductor device.

2. Description of the Related Art

Before the development of techniques for forming deep sub-micron semiconductor devices, critical dimension (CD) of devices used to be quite large. Although there is some misalignment in a photolithographic process so that the vias are slightly offset, later-formed contacts can still land on the desired metal conductive lines. Operating characteristics of the device are affected very little by the misalignment.

FIG. 1 is a schematic, cross-sectional view showing an interconnect structure according to the prior art. As shown in FIG. 1, a plug 118 is formed on a metal conductive line 104. The plug 118 is a conductive structure in a via 114 formed in an inter-metal dielectric (IMD) layer 112. A structure between the metal conductive line 104 and a substrate 100 is another IMD layer or an interlayer dielectric layer 102.

Therefore, when techniques for fabricating deep submicron devices are employed, critical dimensions of devices shrink considerably. A very small misalignment of the via 114 or the plug 118 to the conductive line 104 often can have considerable effect on the operating characteristics of the devices. Thus, alignments of the via 114 and the plug 118 to the conductive line 104 become critical, especially when the desired dimension of the device exceeds or approaches the acceptable tolerance of the fabricating equipment. Hence, the conventional method is incapable of fabricating a via or a plug that lands exactly on the desired location according to deep-submicron device specification.

Therefore, innovative techniques for forming a borderless via or plug are required in order to fabricate a deep submicron device. In particular, the formation of interconnects between a large number of layers to form a multi-level interconnect (MLM) system depends very much on the capacity to form the high-quality borderless via or plug.

In addition, according to the prior art, an over-etching process is required in the fabrication of an interconnect structure. However, in the over-etching process, a metal conductive line is exposed, and the exposed metal conductive line reacts with an etching agent. The contact resistance Rc of the via is thus increased.

SUMMARY OF THE INVENTION

According to above, the invention provides an improved process for forming a borderless via in a semiconductor device. The process comprises the following steps. A conductive layer, a borophosphosilicate glass (BPSG) layer and a patterned first photoresist mask layer are formed in a dielectric layer in sequence. The BPSG layer is patterned into a BPSG plug while using the patterned first photoresist mask layer as a mask. A second photoresist mask layer is formed to cover the patterned first photoresist mask layer and the metal layer. The conductive layer is defined to form a conductive line beneath the BPSG plug and the second mask layer. The first and second photoresist mask layers are removed. An inter-metal dielectric layer is formed around the BPSG plug and the conductive line. A via is formed in the inter-metal dielectric layer by removing the BPSG plug. A barrier layer and a metal layer fill the via to form a metal plug.

Thus, in the invention, the via process of the multi-layer interconnection can be successfully performed even if a misalignment occurs.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIG. 2A through FIG. 2F are schematic, cross-sectional views showing a process for forming a borderless via in a semiconductor device according to a preferred embodiment of the invention.

Figure 1:
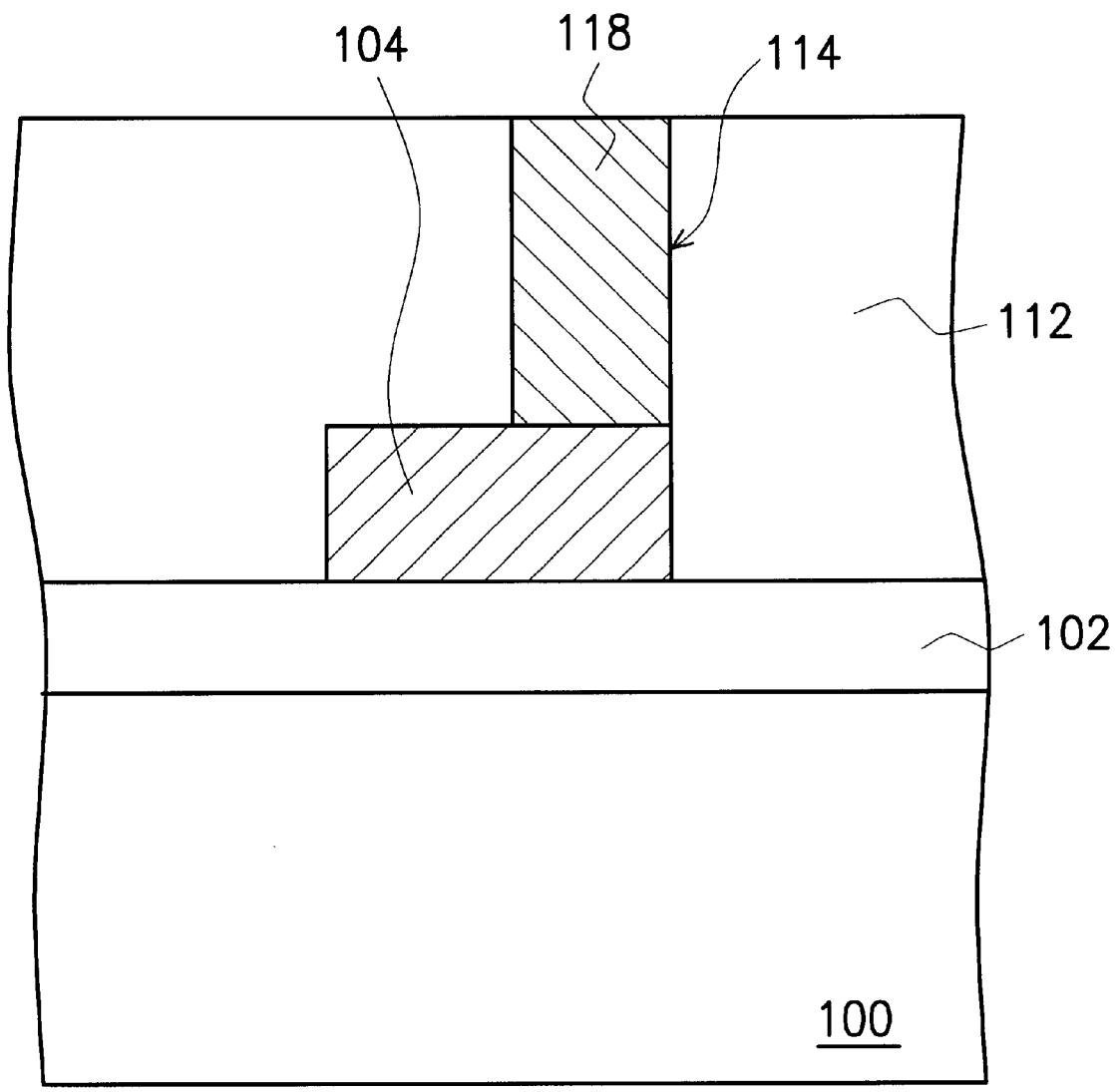
FIG. 1 is a schematic, cross-sectional view showing an interconnect structure according to the prior art.
Figure 2A:
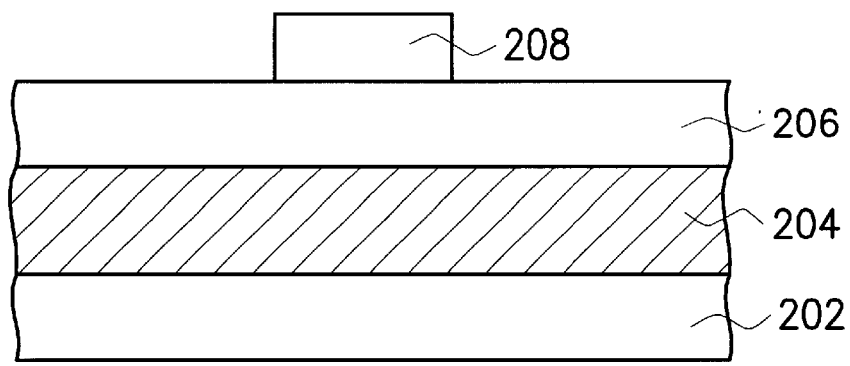
FIG. 2A through FIG. 2F are schematic, cross-sectional views showing a process for forming a borderless via in a semiconductor device according to a preferred embodiment of the invention.

Referring to FIG. 2A, a dielectric layer 202 is provided. A conductive layer 204 and a borophosphosilicate glass (BPSG) layer 206 are formed in a dielectric layer 202 in sequence. A patterned first mask layer 208 is formed on the BSPG layer 206. The material used as the conductive layer 204 can be either a metal or a doped polysilicon, the patterned first mask layer comprises a photoresist layer, and the dielectric layer 202 can be an interlayer dielectric layer or an inter-metal dielectric layer.

Figure 2B:
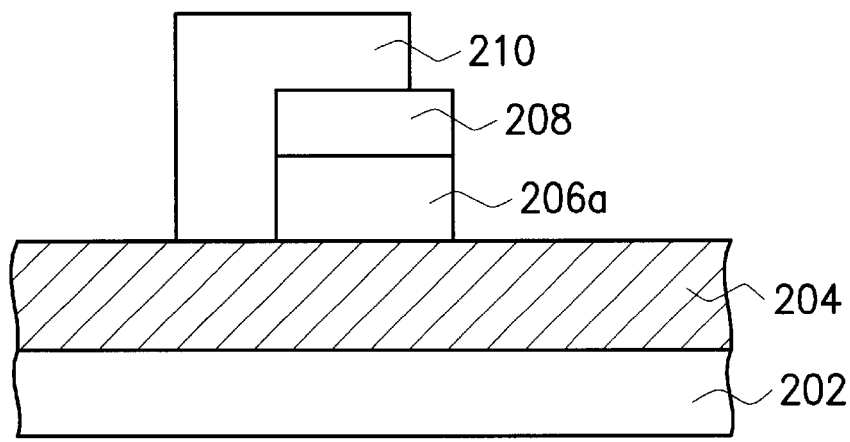

Referring to the FIG. 2B, a first etching process is performed to pattern the BPSG layer 206 into a BPSG plug 206a while using the patterned first mask layer 208 as a mask and the metal layer 204 as an etching stop.

A mask layer (not shown) is formed to cover the patterned first mask layer 208 and the conductive layer 204. Referring to FIG. 2B, the mask layer is patterned into a second mask layer 210 to cover the patterned first mask layer 208 and the conductive layer 204 wherein the patterned second mask layer 210 comprises a photoresist layer. However, since the conductive layer 204 covered by the BPSG plug 206a is in a position pre-determined for a conductive line, in other words, the BPSG plug 206a must align with the later-formed conductive line, it is not necessary that the second mask layer 210 fully covers the patterned first mask layer 208 and the conductive layer 204.

Figure 2C:
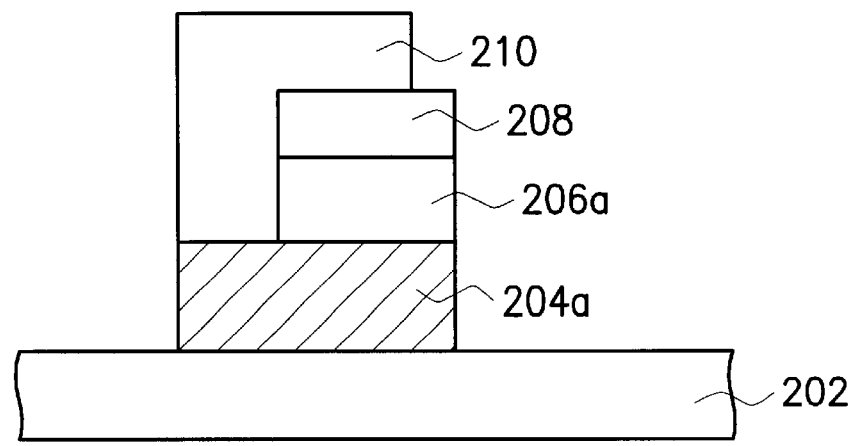

Referring to FIG. 2C, a second etching process is performed to pattern the conductive layer 204 and form a conductive line 204a beneath the second mask layer 210 and the BPSG plug 206a. Thus, even though the misalignment of the second mask layer 210 occurs, the conductive line still aligns with the BPSG plug 206a. That is, a borderless via later-formed by moving BPSG plug 206a must land on the conductive line 204a.

Figure 2D:
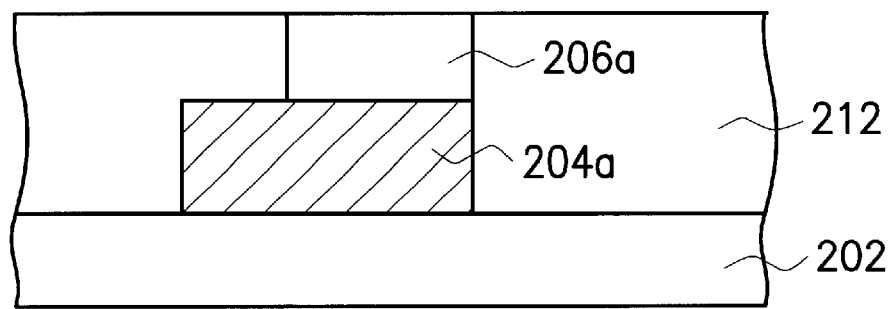

Referring to FIG. 2D, the first mask layer 208 and the second mask layer 210 are removed. An inter-metal dielectric layer 212 is formed around the BPSG plug 206a and the conductive line 204a. For example, the process of forming the inter-metal dielectric layer 212 comprises forming a dielectric layer (not shown) by, for example, chemical vapor deposition to cover the BPSG plug 206a and the conductive line 204a and performing chemical mechanical polishing while using the BPSG plug 206a as a polishing stop layer.

Figure 2E:
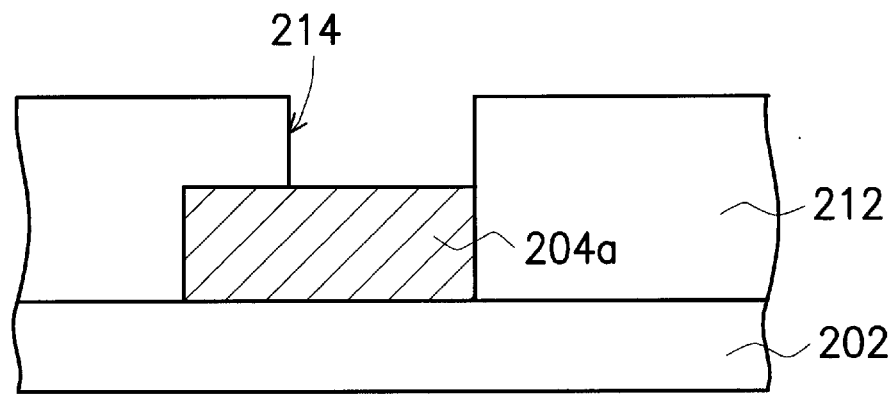

Referring to FIG. 2E, a borderless via 214 is formed in the inter-metal dielectric layer 212 by removing the BPSG plug 206a. The BPSG plug 206a is removed by, for example, using hydrogen fluoride (HF) as an etching gas. According to the studies proposed by N. MiKi et al. in Elec. Dev., 37(1), p107, 1990 and by H. Watanabe et al. in IEDM'92, p259, the experimental data show that the selectivity of BPSG to a inter-metal dielectric layer is relatively high; thus, the etching process is efficient in removing the BPSG plug 206a.

Figure 2F:
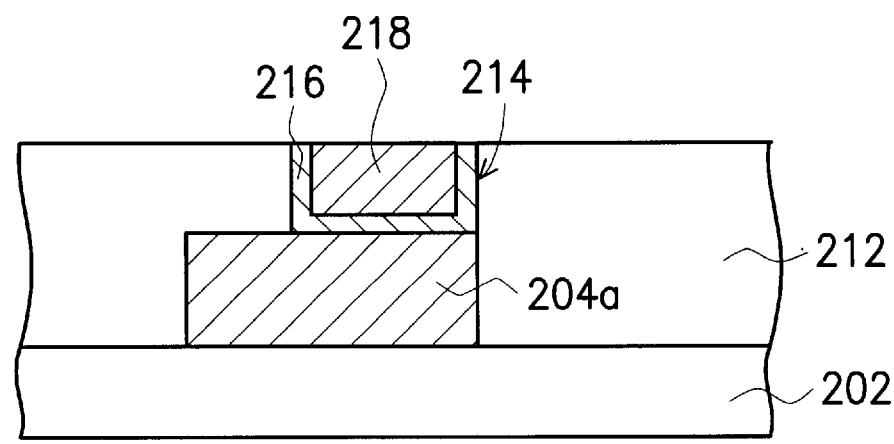

Referring to FIG. 2F, a barrier layer 216 and a metal layer 218 fill the borderless via 214 to form a metal plug. The metal layer 218 is tungsten, aluminum or copper. The barrier layer 216 comprises a Ti/TiN layer. For example, the process of forming the metal plug comprises forming a conformal barrier layer on the borderless via 214, filling the borderless via 214 with a tungsten layer wherein the tungsten layer is over the inter-metal dielectric layer 212 and the conformal barrier layer, and performing dry etching or chemical mechanical polishing to remove the tungsten layer and the conformal barrier layer over the inter-metal dielectric layer 212.

According to the preferred embodiment of the invention, since the alignment of the via to the metal conductive line is pre-determined by the first photoresist layer, the metal plug must land on the metal conductive line through the via whether the misalignment of the second photoresist layer occurs or not. Thus, the borderless via provided by the invention can overcome the problem of misalignment in high integration process. In addition, an over-etching process of via is not required in the invention; thus, the resistance Rc of the via is not increased. Thus, the process provided by the invention can increase the integration of the semiconductor device and form a borderless via that can exactly align with the conductive line.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A process for forming a borderless via in a semiconductor device, comprising:

providing a dielectric layer;

forming a conductive layer and a borophosphosilicate glass (BSG) layer over the dielectric layer in sequence;

forming a patterned first photoresist mask layer to cover the borophosphosilicate glass layer;

performing a first etching process to pattern the borophosphosilicate glass layer into a borophosphosilicate glass plug while using the patterned first mask layer as a mask;

forming a second photoresist mask layer to cover the patterned first mask layer and the conductive layer;

performing a second etching process to pattern the conductive layer using the patterned first mask layer and the second photoresist mask layer as an etching mask in order to form a conductive line beneath the borophosphosilicate glass plug and the second mask layer;

removing the first photoresist mask layer and second photoresist mask layer;

forming an inter-metal dielectric layer around the borophosphosilicate glass plug and the conductive line;

removing the borophosphosilicate glass plug to form a borderless via in the inter-metal dielectric layer; and filling the borderless via with a barrier layer and a metal layer to form a metal plug.

2. The process of claim 1, wherein a method of removing the borophosphosilicate glass plug comprises etching the borophosphosilicate glass plug with hydrogen fluoride (HF) vapor.

3. The process of claim 1, wherein the metal plug comprises a combination of a conformal barrier layer and a tungsten layer.

4. The process of claim 1, wherein the barrier layer comprises a Ti/TiN (titanium/titanium nitride) layer.

5. The process of claim 1, wherein the method of forming the inter-metal dielectric layer comprises:

forming a dielectric layer to cover the borophosphosilicate glass plug and the metal conductive line; and performing chemical mechanical polishing while using the borophosphosilicate glass plug as a polishing stop layer.

6. The process of claim 1, wherein the inter-metal dielectric layer comprises an interlayer dielectric layer.

7. The process of claim 1, wherein the inter-metal dielectric layer comprises an inter-metal dielectric layer.

8. The process of claim 1, wherein the patterned first mask layer comprises a photoresist layer.

9. The process of claim 1, wherein the second mask layer comprises a photoresist layer.

10. The process of claim 1, wherein the conductive layer is selected from a group consisting of a metal layer and a doped polysilicon layer.

11. The process of claim 1, wherein a material of the metal layer is selected from a group consisting of tungsten, aluminum, and copper.

* * * * *